United States Patent
Wens et al.

(10) Patent No.: US 10,262,091 B2
(45) Date of Patent: Apr. 16, 2019

(54) METHOD AND SYSTEM FOR CALCULATING MODEL PARAMETERS FOR A CAPACITOR TO BE MODELLED

(71) Applicant: MinDCet N.V., Leuven (BE)

(72) Inventors: Mike Irena Georges Wens, Burg-Reuland (BE); Jef Thoné, Borgerhout (BE)

(73) Assignee: MinDCet N.V., Leuven (BE)

( * ) Notice: Subject to any disclaimer, the term of this patent is extended or adjusted under 35 U.S.C. 154(b) by 279 days.

(21) Appl. No.: 14/933,578

(22) Filed: Nov. 5, 2015

(65) Prior Publication Data
US 2016/0132625 A1  May 12, 2016

(30) Foreign Application Priority Data

Nov. 7, 2014 (BE) .................................. 2014/5055

(51) Int. Cl.
| | |
|---|---|
| G06F 17/50 | (2006.01) |
| H02M 3/157 | (2006.01) |
| G01R 27/26 | (2006.01) |
| H02M 3/10 | (2006.01) |
| H02M 3/28 | (2006.01) |

(Continued)

(52) U.S. Cl.
CPC ..... *G06F 17/5036* (2013.01); *G01R 27/2605* (2013.01); *G06F 17/10* (2013.01); *H02M 3/10* (2013.01); *H02M 3/157* (2013.01); *H02M 3/28* (2013.01); *G01R 27/26* (2013.01); *G05B 13/02* (2013.01)

(58) Field of Classification Search
CPC .... G06F 17/5036; G06F 17/10; H02M 3/157; H02M 3/28; H02M 3/10; G01R 27/2605; G01R 27/26; G05B 13/02
See application file for complete search history.

(56) References Cited

U.S. PATENT DOCUMENTS

| | | | |
|---|---|---|---|
| 2012/0098553 A1* | 4/2012 | Karlsson | H02M 3/157 324/684 |
| 2012/0281436 A1* | 11/2012 | Cuk | H02M 3/33569 363/21.03 |

(Continued)

FOREIGN PATENT DOCUMENTS

| | | |
|---|---|---|
| WO | 2010/149234 A1 | 12/2010 |
| WO | 2013/110145 A1 | 8/2013 |

*Primary Examiner* — Ajay Ojha
(74) *Attorney, Agent, or Firm* — McDonnell Boehnen Hulbert & Berghoff LLP

(57) ABSTRACT

Method for calculating model parameters for a capacitor to be modelled, the method comprising the following steps of: incorporating the capacitor to be modelled into a DC to DC converter with at least a first switching element; connecting a resistive load between the output terminals; applying an input voltage to the input terminals of the converter; controlling the first switching element in accordance with a frequency and duty cycle in order to obtain a current varying periodically in time through the capacitor to be modelled; measuring at least a first quantity representative of the current through the capacitor and at least a second quantity representative of the voltage across the capacitor; determining on the basis of the measured first and second quantities at least one current value for the current through the capacitor and at least one voltage value for the voltage across the capacitor.

20 Claims, 12 Drawing Sheets

(51) Int. Cl.
*G06F 17/10* (2006.01)
*G05B 13/02* (2006.01)

(56) References Cited

U.S. PATENT DOCUMENTS

| | | | |
|---|---|---|---|
| 2014/0372059 A1* | 12/2014 | Wens | G01R 27/2611 702/65 |
| 2015/0109824 A1* | 4/2015 | Chen | H02M 3/22 363/17 |

* cited by examiner

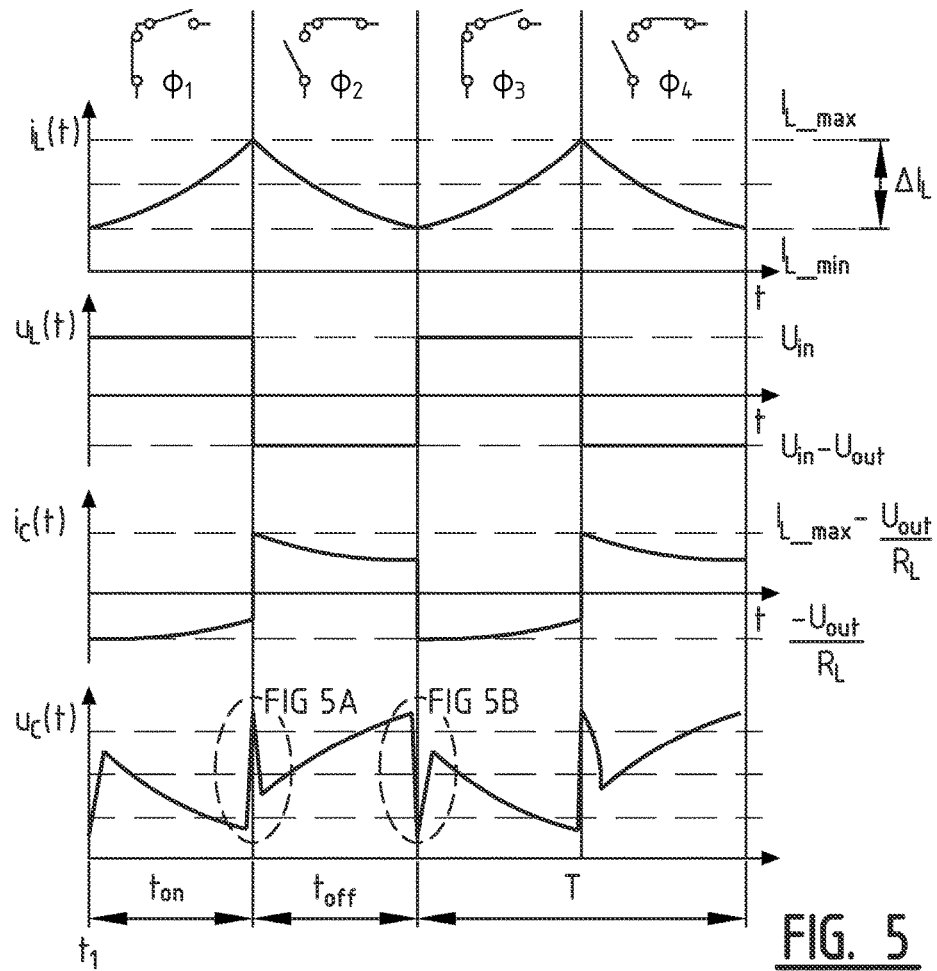
FIG. 5
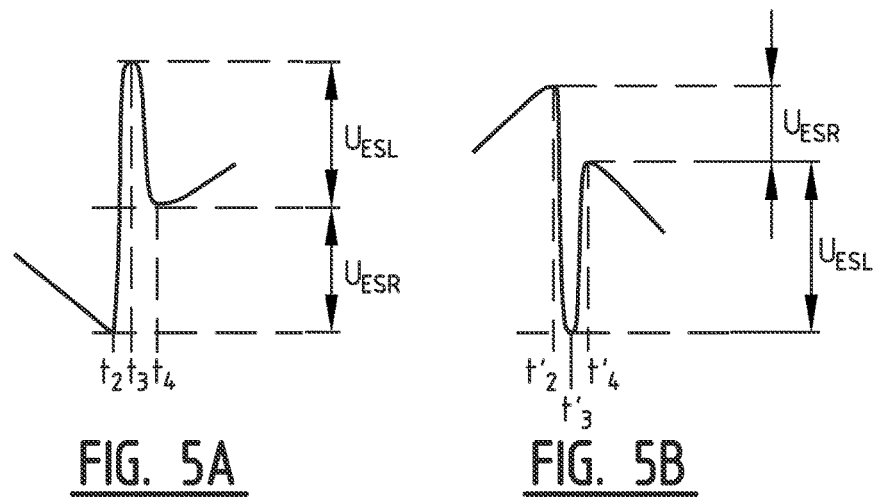
FIG. 5A
FIG. 5B

METHOD AND SYSTEM FOR CALCULATING MODEL PARAMETERS FOR A CAPACITOR TO BE MODELLED

CROSS-REFERENCE TO RELATED APPLICATIONS

This application claims priority under 35 U.S.C. § 119 to Belgian Patent Application No. 2014/5055, filed on Nov. 7, 2014, and entitled "Method and system for calculating model parameters for a capacitor to be modelled", the full disclosure of which is incorporated herein by reference.

TECHNICAL FIELD

The present invention relates to a method and a system for calculating model parameters for a capacitor to be modelled.

BACKGROUND

The properties of a capacitor are dependent on the voltage applied across the capacitor and/or the current applied through the capacitor, and are particularly dependent on the amplitude, frequency and waveform of these signals. A known technique for measuring a capacitor uses a so-called LCR meter. Used as signal source in an LCR meter is a sine wave.

When a capacitor is used in a circuit, the signals are often not sine waves, but rather block waves or sawtooth, and high currents and/or voltages can occur. Practice has shown that in such conditions an LCR meter does not produce good values for accurate modelling of the capacitor.

WO 2013/110145 discloses a method for calculating model parameters for a coil, comprising of: incorporating the coil into a converter with a switching element; connecting a resistive load; applying an input voltage; controlling the switching element in order to obtain a periodically varying voltage across the coil; measuring at least a first and second quantity representative of respectively the voltage across and the current through the coil; determining at least one voltage value and at least one current value on the basis of the measured first and second quantity; calculating a loss resistance and/or a loss power of the coil on the basis of the at least one voltage value and the at least one current value.

The model that is being used for modelling a coil in WO 2013/110145 comprises a series connection of an inductance L and a loss resistance $R_{LS}$. Modelling a capacitor is more complex. FIG. 3 of the present application illustrates a possible model for a capacitor comprising a parallel circuit of a loss resistance $R_{leak}$ and of a series circuit of a capacitance $C_{TEST}$, a parasitic inductance $L_{ESL}$, a parasitic resistance $R_{ESR}$. Because the parasitic inductance $L_{ESL}$ needs to be determined, the skilled person needs to find a way to deal with parasitic inductance in the measurement circuit. This implies that a measurement circuit for modelling coils cannot be simply adapted to be used for modelling capacitors.

SUMMARY OF THE INVENTION

The present invention has for its object to provide a system and method of the type stated in the preamble with which a capacitor can be modelled in a wide range in a manner which is accurate and can be readily implemented in practice, i.e. a system and method with which model parameters, such as the capacitance and the losses and non-linearities, of a capacitor can be modelled for a wide range of applications.

According to a first aspect, the invention relates to a method for calculating model parameters for a capacitor to be modelled. The method comprises the following steps of: incorporating the capacitor to be modelled into a DC to DC converter with at least a first switching element; which DC to DC converter has input terminals and output terminals; connecting a resistive load between the output terminals of the DC to DC converter; applying an input voltage to the input terminals of the DC to DC converter; controlling the first switching element in accordance with a frequency and duty cycle in order to obtain a current varying periodically in time through the capacitor to be modelled, which current depends at least for a part of a period on the input voltage; measuring at least a first quantity representative of the current through the capacitor at successive points in time in at least said part of a period; measuring at least a second quantity representative of the voltage across the capacitor at successive points in time in at least said part of a period; determining on the basis of the measured first quantity at least one current value for the current through the capacitor; determining on the basis of the measured second quantity at least one voltage value for the voltage across the capacitor; repeating the above stated steps for at least one of: a different input voltage, a different frequency, a different duty cycle, a different resistive load; calculating model parameters of the capacitor on the basis of the measured quantities. The successive points in time preferably cover a substantially complete period.

Incorporating a capacitor into a DC to DC converter creates a realistic operating environment of the capacitor. Such an operating environment further allows a number of input parameters, such as the input voltage, the frequency, the duty cycle and the resistance value of the load, to be varied in accordance with the operating range over which it is desired to characterize the capacitor. An accurate result can further be obtained by making use of successive measurements.

The model parameters preferably comprise a capacitance and at least one of the following: a parasitic inductance intended for connection in series to the capacitance, a parasitic resistance intended for connection in series to the capacitance, and a loss power. In addition, the model parameters can also comprise a leakage resistance which is connected in parallel in the model to the series connection of the capacitance, the parasitic inductance and the parasitic resistance.

The method preferably further comprises of: measuring a quantity representative of the current through the resistive load at successive points in time in at least said part of a period.

In a preferred embodiment the DC to DC converter comprises a coil and a second switching element which are arranged such that in the coil the current builds up in the coil in a first position of the first switching element and that in the coil the current falls away in the coil in a second position of the first switching element. In such an embodiment it is possible, instead of or in addition to measuring the current through the resistive load, to also measure a quantity representative of the current through the coil at successive points in time in at least said part of the period. Providing a coil in the DC-DC converter causes current peaks during switching of the first switching element which make it possible to properly characterize particularly the parasitic resistance and the parasitic inductance. The coil is for instance a boost coil which is charged during discharge of the capacitor in the resistive load.

In a preferred embodiment the capacitor is connected in parallel to the resistive load. The capacitor will in this way at least partially discharge in the resistive load in a first or second position of the switch, whereby characterizing of particularly the capacitance of the capacitor can take place in simple manner. The second switching element, for instance a diode, preferably switches substantially synchronously with the first switching element.

The DC-DC converter is preferably configured to display at least one of a boost converter behaviour and a buck converter behaviour. The voltage across a coil of the DC to DC converter will in this way display substantially a block form (boost behaviour) or a substantially triangular progression (buck behaviour). Both voltage progressions allow a good characterizing of the capacitor. The DC to DC converter is for instance a classical boost converter with a boost coil, but can also be one of the following: a buck converter, buck-boost converter, non-inverting buck-boost converter, a sepic converter (single-ended primary-inductor converter), a reverse sepic converter, a cuk converter, a resonant converter, a push-pull converter, a fly-back converter, full bridge converter.

According to an exemplary embodiment, the method comprises of: determining on the basis of the measured second quantity at least a first and second voltage value for the voltage across the capacitor at respectively a first and a second point in time ($t_1$, $t_2$) of the successive points in time, which first and second points in time are preferably chosen during discharge of the capacitor in the resistive load; and calculating the capacitance of the capacitor on the basis of at least the first and second voltage value, the time difference between the first and second points in time ($t_1$, $t_2$) and the resistance of the resistive load.

According to an exemplary embodiment, the loss power is calculated as an integral of the product of the voltage across the capacitor and the current through the capacitor on the basis of the measurements of the first and second quantity at the successive points in time, wherein the successive points in time preferably cover a substantially complete period.

According to an exemplary embodiment, the method comprises of: determining on the basis of the measured second quantity at least a third and fourth voltage value for the voltage across the capacitor at respectively a third and a fourth point in time ($t_3$, $t_4$) of the successive points in time in said part of the period; which third and fourth points in time are located in a transition period during which the first switching element switches; calculating the parasitic inductance on the basis of at least the third and fourth voltage value. According to an exemplary embodiment the parasitic inductance ($L_{ESL}$) is calculated as $$L_{ESL} = \text{abs}(U_4 - U_3) t_{trans}/(I_{out} + I_L)$$

wherein $U_4$ and $U_3$ are respectively the third and fourth voltage value, $t_{trans}$ is the transition period, $I_{OUT}$ is the average current through the resistive load during the transition period and $I_L$ is the maximum or minimum input current in the DC-DC converter depending on whether the capacitor switches from discharge to charge or vice versa; wherein the third point in time ($t_3$) is chosen as a time at which the voltage value is maximal or minimal depending on whether the capacitor switches from discharge to charge or vice versa, and wherein the fourth point in time ($t_4$) corresponds to the end of the transition period.

According to an exemplary embodiment, the method comprises of: determining on the basis of the measured second quantity at least two voltage values for the voltage across the capacitor at respectively a second and a fourth point in time ($t_2$, $t_4$) of the successive points in time in said part of the period; which second and fourth point in time are located in a transition period during which the first switching element switches; and calculating the parasitic resistance on the basis of at least the two voltage values. According to an exemplary embodiment the parasitic resistance ($R_{ESR}$) is calculated as $$R_{ESR} = \text{abs}(U_4 - U_2)/(I_{OUT} + I_L)$$

wherein $U_4$ and $U_2$ are respectively the two voltage values at the fourth and second points in time ($t_4$, $t_2$), $I_{OUT}$ is the average current through the resistive load during the transition period and $I_L$ is the maximum or minimum input current in the DC-DC converter depending on whether the capacitor switches from discharge to charge or vice versa; wherein the second point in time ($t_2$) corresponds to the beginning of the transition period, and wherein the fourth point in time ($t_4$) corresponds to the end of the transition period.

In an alternative embodiment, which is particularly advantageous when the parasitic inductance ($L_{ESL}$) is small and the parasitic inductances of the measurement circuit itself and the parasitic capacitance of the non-ideal first and second switches are non negligible, the method may comprise determining on the basis of the measured second quantity an oscillation frequency for the voltage across the capacitor between respectively a third and a fourth point in time ($t_3$, $t_4$) of the successive points in time in said part of the period; which third and fourth points in time are located in a transition period during which the first switching element switches; and calculating the parasitic inductance on the basis of the measured oscillation frequency. According to an exemplary embodiment the parasitic inductance ($L_{ESL}$) may be determined using the equation:

$$f_{osc} = \frac{1}{2\pi\sqrt{(L_{par} + L_{ESL}) \cdot C_{par}}}$$

wherein $f_{osc}$ is the measured oscillation frequency, $L_{par}$ is the parasitic inductance of a measurement circuit including the DC-DC convertor, and $C_{par}$ the parasitic capacitance of the non-ideal first and second switches. The parasitic capacitance ($C_{par}$) of the non-ideal switches may be measured using any known technique, and the parasitic inductance ($L_{par}$) of the measurement circuit may be determined by measuring first a known reference capacitor using the same measurement circuit and measuring the oscillation frequency $f_{oscref}$ to determine the parasitic inductance ($L_{par}$) using $$f_{oscref} = \frac{1}{2\pi\sqrt{(L_{par} + L_{ESLref}) \cdot C_{par}}}.$$

On the basis of the determined values for the parasitic inductance ($L_{par}$) of the measurement circuit and the parasitic capacitance ($C_{par}$), the parasitic inductance ($L_{ESL}$) can be calculated using the equation above for $f_{osc}$ and the measured value of the oscillation frequency $f_{osc}$. In other words, by using the oscillation frequency $f_{oscref}$ of a reference set-up and the oscillation frequency $f_{osc}$ of the set-up with the capacitor under test, the parasitic inductance ($L_{ESL}$) can be determined.

In a preferred embodiment said part of the period comprises a first part in which the capacitor is discharged in the resistive load, and a second part in which the capacitor is charged via the DC-DC converter.

According to a second aspect of the invention, a computer program is provided which has computer instructions for performing at least the calculation steps of the method of any of the foregoing embodiments. According to yet another aspect, a storage medium is provided on which computer instructions are stored for performing at least the calculation steps of the method of any of the foregoing embodiments.

According to a third aspect of the invention, a system is provided for calculating model parameters for at least one coil to be modelled, the system comprising: a DC to DC converter with at least a first switching element and a capacitor to be modelled incorporated therein; which DC to DC converter has input terminals and output terminals; a resistive load between the output terminals of the DC to DC converter; a voltage source connected for the purpose of providing an input voltage to the input terminals of the converter; control means for controlling the first switching element in accordance with a frequency and duty cycle in order to obtain a current varying periodically in time through the capacitor to be modelled, which current depends at least for a part of a period on the input voltage; first measuring means for measuring at least a first quantity representative of the current through the capacitor at successive points in time in at least said part of a period; second measuring means for measuring at least a second quantity representative of the voltage across the capacitor at successive points in time in at least said part of a period; computer means for determining on the basis of the measured first quantity at least one current value for the current through the capacitor; for determining on the basis of the measured second quantity at least one voltage value for the voltage across the capacitor; and for calculating model parameters of the capacitor on the basis of the determined voltage values.

According to a preferred embodiment, the computer means are further configured to calculate a capacitance and at least one of the following: a parasitic inductance intended to be connected in series to the capacitance, a parasitic resistance intended to be connected in series to the capacitance, and a loss power.

The system preferably further comprises: measuring means for measuring a quantity representative of the current through the resistive load at successive points in time in at least said part of a period.

In a preferred embodiment of the system the DC to DC converter comprises a coil and a second switching element which are arranged such that in the coil the current builds up in the coil in a first position of the first switching element, and that in the coil the current falls away in the coil in a second position of the first switching element. In such an embodiment it is possible, instead of or in addition to the measuring means for measuring the current through the resistive load, to also provide measuring means for measuring a quantity representative of the current through the coil at successive points in time in at least said part of a period. The capacitor is preferably connected in parallel to the resistive load. The DC-DC converter of the system is preferably configured to display at least one of a boost converter behaviour and a buck converter behaviour.

According to an exemplary embodiment, the computer means are configured: to determine on the basis of the measured second quantity at least a first and second voltage value for the voltage across the capacitor at respectively a first and a second point in time ($t_1$, $t_2$) of the successive points in time, which first and second points in time are preferably chosen during discharge of the capacitor in the resistive load; and to calculate the capacitance of the capacitor on the basis of at least the first and second voltage value, the time difference between the first and second points in time ($t_1$, $t_2$) and the resistance of the resistive load. According to a further exemplary embodiment, the computer means are configured to calculate the loss power as an integral of the product of the voltage across the capacitor and the current through the capacitor on the basis of the measurements of the first and second quantity at the successive points in time, wherein the successive points in time preferably cover a substantially complete period.

According to an exemplary embodiment, the computer means are configured: to determine on the basis of the measured second quantity at least a third and fourth voltage value for the voltage across the capacitor at respectively a third and a fourth point in time ($t_3$, $t_4$) of the successive points in time in said part of the period; which third and fourth points in time are located in a transition period during which the first switching element switches; to calculate the parasitic inductance on the basis of at least the third and fourth voltage value. According to an exemplary embodiment the parasitic inductance ($L_{ESL}$) is calculated as $$L_{ESL} = \text{abs}(U_4 - U_3) t_{trans} / (I_{OUT} + I_L)$$

wherein $U_4$ and $U_3$ are respectively the third and fourth voltage value, $t_{trans}$ is the transition period, $I_{OUT}$ is the average current through the resistive load during the transition period and $I_L$ is the maximum or minimum input current in the DC-DC converter depending on whether the capacitor switches from discharge to charge or vice versa; wherein the third point in time ($t_3$) is chosen as a time at which the voltage value is maximal or minimal depending on whether the capacitor switches from discharge to charge or vice versa, and wherein the fourth point in time ($t_4$) corresponds to the end of the transition period.

According to an exemplary embodiment, the computer means are configured: to determine on the basis of the measured second quantity at least two voltage values for the voltage across the capacitor at respectively a second and a fourth point in time ($t_2$, $t_4$) of the successive points in time in said part of the period; which second and fourth point in time are located in a transition period during which the first switching element switches; and to calculate the parasitic resistance on the basis of at least the two voltage values. According to an exemplary embodiment the parasitic resistance ($R_{ESR}$) is calculated as $$R_{ESR} = \text{abs}(U_4 - U_2) / (I_{OUT} + I_L)$$

wherein $U_4$ and $U_2$ are respectively the two voltage values at the fourth and second points in time ($t_4$, $t_2$), $I_{OUT}$ is the average current through the resistive load during the transition period and $I_L$ is the maximum or minimum input current in the DC-DC converter depending on whether the capacitor switches from discharge to charge or vice versa; wherein the second point in time ($t_2$) corresponds to the beginning of the transition period, and wherein the fourth point in time ($t_4$) corresponds to the end of the transition period.

According to a fourth aspect, the invention relates to a model for a capacitor calculated according to the method of any of the above described embodiments or making use of a system according to any of the above described embodiments.

BRIEF DESCRIPTION OF THE FIGURES

The invention will be further elucidated on the basis of a number of by no means limitative exemplary embodiments of the method and the system according to the invention with reference to the accompanying drawings, in which:

FIG. 5 is a graph showing schematically the current $i_L$ (t) through the coil Lboost, the voltage $u_L$ (t) across the coil Lboost, the current $i_C$ (t) through the capacitor C and the voltage $u_C$ (t) across the capacitor C for the embodiment of FIG. 4;

FIGS. 5A and 5B show schematic detail views of the graph of FIG. 5;

DETAILED DESCRIPTION OF EMBODIMENTS

Figure 1:
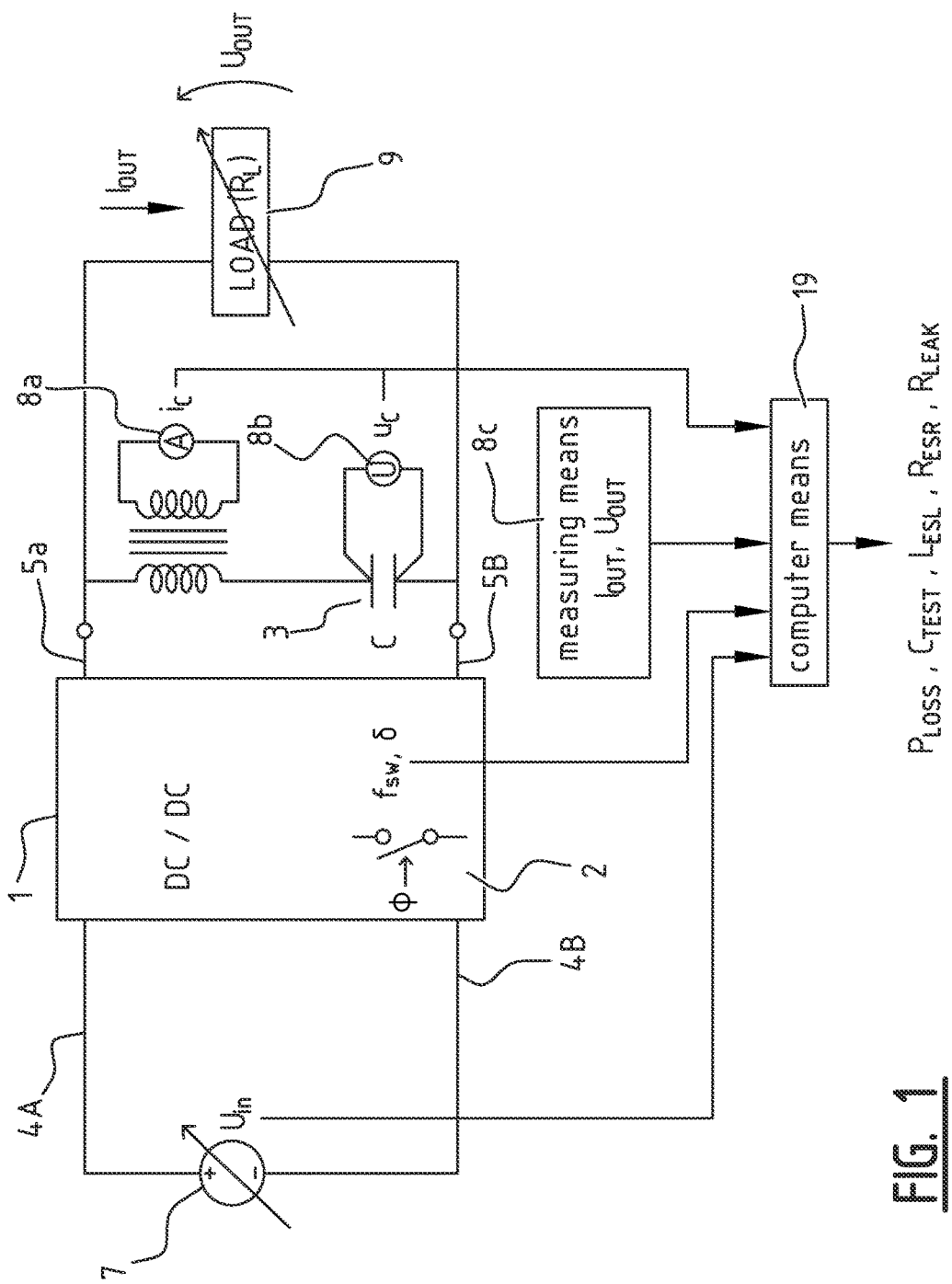
FIG. 1 is a schematic view of an embodiment of a system according to the invention.

A first embodiment of a system and method according to the invention will now be illustrated with reference to FIGS. 1 and 2. The system comprises a DC to DC converter 1 with a first switching element 2. Capacitor 3 for modelling is added to DC to DC converter 1. Converter 1 has input terminals 4a, 4b and output terminals 5a, 5b. Between output terminals 5a, 5b capacitor 3 is connected in parallel to a resistive load 9 with an adjustable resistance $R_L$. An adjustable voltage source 7 is further provided for the purpose of supplying an input voltage $U_{in}$ at input terminals 4a, 4b of the converter. Control means (not shown) are provided for the purpose of supplying a signal Φ for controlling first switching element 2 at a frequency $f_{sw}$ and a duty cycle δ. Further provided are measuring means 8a, 8b, 8c for measuring the voltage $u_C$ across the capacitor, the current $i_C$ through the capacitor, the voltage $u_{OUT}$ across the load $R_L$ and the current $i_{OUT}$ through the load $R_L$. Note that it is not essential to measure $u_{OUT}$ since in theory it is equal to $u_C$. It is however advantageous for control purposes to measure $u_{OUT}$. Measuring means 8a, 8b are preferably configured to measure the voltage across the capacitor $u_C$(t) and the current through the capacitor $i_C$(t) at successive points in time covering a number of periods T=1/$f_{sw}$. Note that it is possible that measuring means 8a, 8b do not measure $u_C$(t) and $i_C$(t) directly, but measure other quantities representative of respectively $u_C$ and $i_C$. A computer means 19 is further provided for calculating model parameters of capacitor C, such as $P_{LOSS}$, $C_{TEST}$, $L_{ESL}$, $R_{ESR}$, $R_{leak}$.

Figure 2:
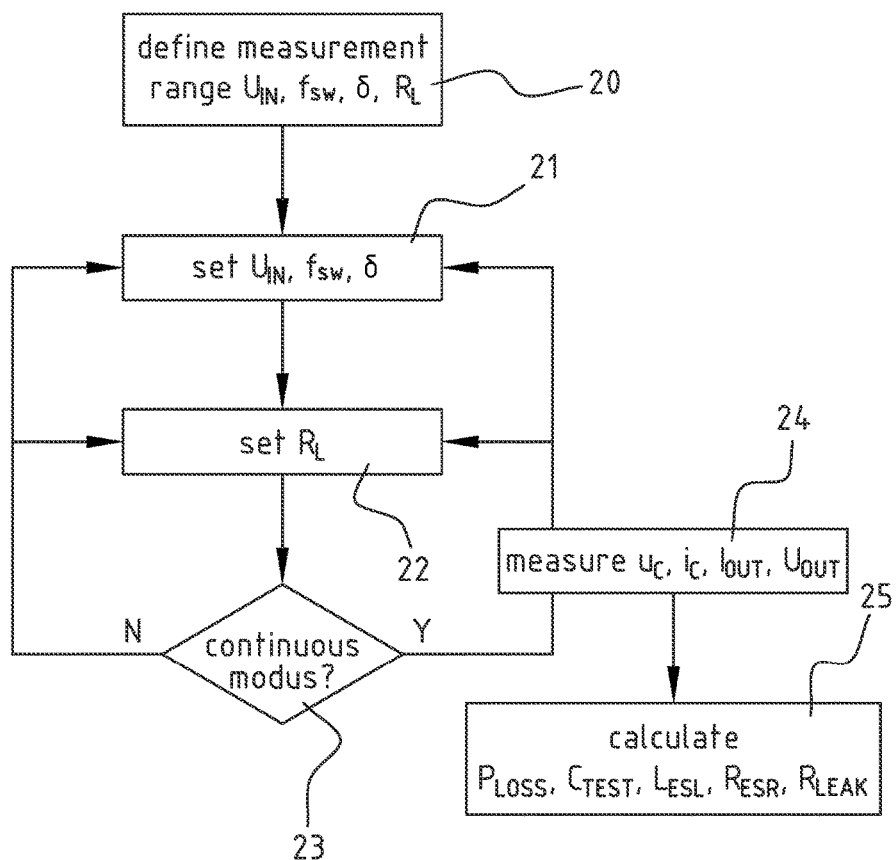
FIG. 2 is a flow diagram illustrating the measuring steps of an embodiment of the method according to the invention.

Following assembly of the measurement setup of FIG. 1 the limits have to be determined for input parameters $U_{in}$, $f_{sw}$, δ and $R_L$ in order to define the measurement range, see step 20 of FIG. 2. In a subsequent step 21 a value is set for $U_{in}$, $f_{sw}$ and δ on the basis of the defined measurement range, and in a second step 22 the resistance $R_L$ of the load is set. Verification then takes place as to whether the DC-DC converter circuit is operating in a Discontinuous Current Mode (DCM) or in a Continuous Current Mode (CCM). In the embodiment illustrated in FIG. 2 measurements are performed only in the CCM mode. If it is determined that the circuit is in a DCM mode, the input parameters are modified in steps 21 and/or 22. Note however that it is also possible to apply the method according to the invention when the converter is in a DCM mode.

Following the measurement of $u_L$, $i_L$, $i_{OUT}$, $u_{OUT}$ in step 24, the input parameters are modified in steps 21 and/or 22. The skilled person will appreciate that it is possible to proceed here in many different ways, and that for instance the input voltage $U_{in}$ can first be varied while the other input parameters $f_{sw}$, δ and $R_L$ can be kept constant, after which $f_{sw}$ and/or δ can be varied, and finally $R_L$. Other sequences likewise fall within the scope of the invention. The measured values are employed in a step 25 to calculate model parameters of capacitor C, such as $P_{LOSS}$, $C_{TEST}$, $L_{ESL}$, $R_{ESR}$, $R_{leak}$.

Figure 3:
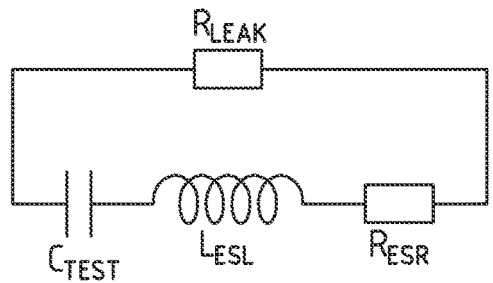
FIG. 3 illustrates a model for a capacitor.

FIG. 3 illustrates a possible model for the capacitor assembled from a parallel circuit of a loss resistance $R_{leak}$ and of a series circuit of a capacitance $C_{TEST}$, a parasitic inductance $L_{ESL}$, a parasitic resistance $R_{ESR}$.

Figure 4:
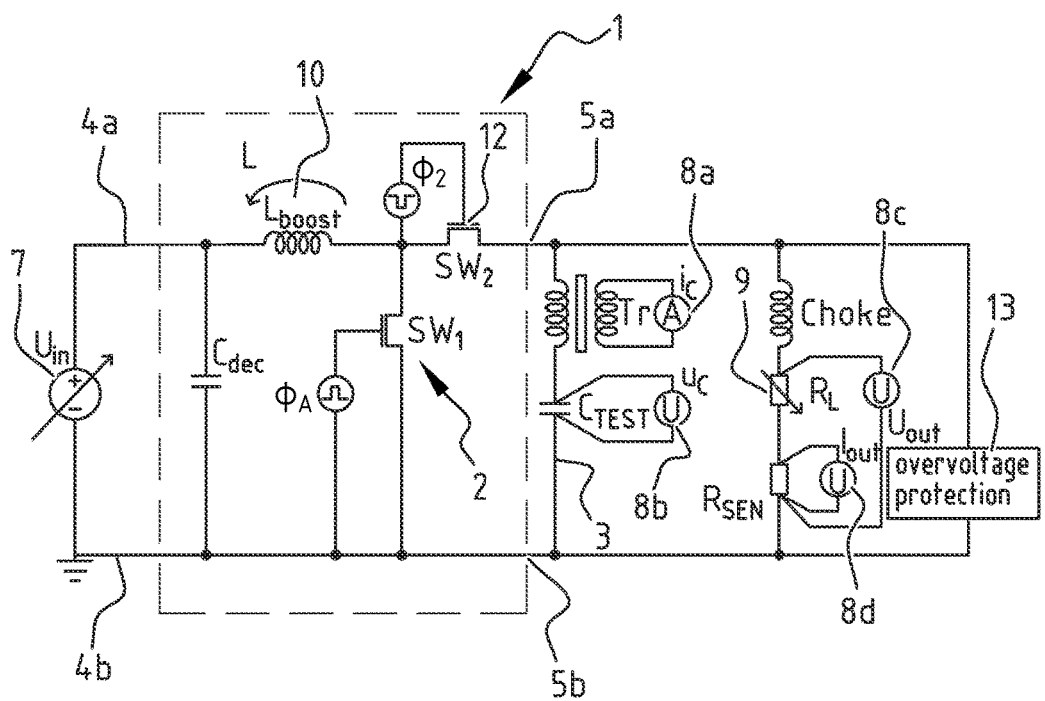
FIG. 4 shows a first embodiment of a measurement setup according to the invention in which a boost converter is used as DC-DC converter.

According to the first variant as illustrated in FIG. 4, the DC to DC converter is a boost converter with a coil 10 (Lboost), an input capacitor 11 (Cdec), a first switching element 2 and a coupled second switching element 12 which is connected in series to coil 10. Coil 10 is connected between a first input terminal 4a and the second switching element 12. First switching element 2 is connected between a second input terminal 4b and the connection between coil 10 and second switching element 12. The other terminal of second switching element 12 is connected to an output terminal 5a. A capacitor 3 (C) to be modelled is inserted between output terminals 5a and 5b in parallel with a resistive load $R_L$.

The inductance of coil 10 is preferably larger than 500 µH (microH). In standard coils of this size the number of windings is very high, resulting in an interaction between the large number of windings on a magnetic core and the parasitic resistance and inter-winding capacitances thereof. In embodiments of the invention coil 10 is judiciously chosen in order to minimize the parasitic resistance and inter-winding capacitances.

Provided for the purpose of measuring the current $i_C$ through capacitor 3 are measuring means 8a which consist in the example of FIG. 4 of a measuring transformer Tr with a primary winding which is connected in series to capacitor 3, and an oscilloscope for measuring the current through the secondary winding of Tr. Measuring means 8b are provided for the purpose of measuring the voltage $u_C$ across capacitor 3. Measuring means 8c, 8d are further provided for measuring the current $I_{OUT}$ (by means of a small resistance Rsen in series with resistive load 9) and the voltage $U_{OUT}$. Resistive load 9 is preferably connected in series to a choke coil for blocking high-frequency AC currents, while low-frequency and DC currents are allowed through. According to a variant, measuring means (not shown) can also be provided, instead of or in addition to measuring means 8d, for the purpose of measuring the current $i_L$ through coil 10 and the voltage $u_L$ across coil 10.

FIG. 5 illustrates schematically typical measuring results for $i_L$, $u_L$, $i_C$ and $u_C$ as a function of time. This schematic graph shows a linear current progression $i_L$, while the skilled person will appreciate that this progression is typically exponential. The voltage progression $u_L$ is further shown schematically as a block wave, and the skilled person will appreciate that the voltage across the coil Lboost is not wholly constant during charging ($t_{on}$, switch SW1 closed and SW2 open) and discharging ($t_{off}$, switch SW1 open and SW2 closed) of the coil. The current $i_L$ through the coil Lboost varies between a minimum value $I_{Lmin}$ and a maximum value $I_{Lmax}$. During charging the voltage across the coil $u_L$ is equal to $U_{in}$ and during discharge $u_L$ is equal to $U_{in}-u_{OUT}$, wherein $u_{OUT}$ is the voltage across load 9.

For the embodiment of FIG. 5 the loss power can be calculated on the basis of the following formula:

$$P_{loss} = \frac{1}{T} \cdot \int_0^T i_C(t) \cdot u_C(t) dt$$

Wherein T is the period ($T=t_{on}+t_{off}=1/f_{sw}$), $i_C(t)$, $i_C(t)$ is the current measured through the capacitor and $u_C(t)$ is the voltage measured across the capacitor at successive points in time t.

The capacitance $C_{TEST}$ can be calculated on the basis of at least one first and second voltage value for the voltage $u_C$ across the capacitor at respectively a first and a second point in time ($t_1$, $t_2$), for instance at the beginning and the end of discharge of capacitor 3 in resistive load 9, i.e. at the beginning and the end of $t_{on}$ ($t_{on}=t_2-t_1$), see FIG. 5 and FIG. 5A:

$$C_{TEST} = \frac{-(t_2-t_1)}{R_L \ln\left[\frac{u_C(t_2)}{u_C(t_1)}\right]}$$

The parasitic inductance $L_{ESL}$ can be calculated on the basis of at least a third and fourth voltage value for the voltage across the capacitor at respectively a third and a fourth point in time $t_3$, $t_4$. The third and fourth point in time are preferably chosen at the beginning and the end of a transition period following switching of first switch 2 (SW1). If a transition period from $t_{on}$ to $t_{off}$ is used, $t_3$ then preferably coincides with the highest value for $u_C$ during this transition period and $t_4$ with the minimum of $u_C$ before the capacitor begins to recharge, see FIG. 5A. The parasitic inductance ($L_{ESL}$) can then be calculated as $$L_{ESL}=U_{ESL}*t_{trans}/(I_{OUT}+I_{Lmax})$$

wherein $t_{trans}$ is the duration of the switching transition period of a real switch SW1 at the transition from $t_{on}$ to $t_{off}$, $I_{Lmax}$ is the maximum value of the current $i_L$ through boost coil 10 and $I_{OUT}$ is the average value of the current $i_{OUT}$ during the switching transition period. In the example of FIG. 5A $t_{trans}=t_4-t_2$, and $U_{ESL}=u_C(t_3)-u_C(t_4)$.

If a transition period from $t_{off}$ to $t_{on}$ is used, $t_3'$ then preferably coincides with the lowest value for $u_C$ during this transition period and $t_4'$ with the maximum of $u_C$ before the capacitor begins to discharge again, see FIG. 5B. The parasitic inductance ($L_{ESL}$) can then be calculated as $$L_{ESL}=U_{ESL}*t_{trans}'/(I_{OUT}+I_{Lmin})$$

wherein $t_{trans}'$ is the duration of the switching transition period of a real switch SW1 at the transition from $t_{on}$ to $t_{off}$, $I_{Lmin}$ is the minimum value of the current $i_L$ through boost coil 10, and $I_{OUT}$ is the average value of the current $i_{OUT}$ during the switching transition period $t_{trans}'$. In the example of FIG. 5B $t_{trans}'=t_4'-t_2'$, and $U_{ESL}=u_C(t_4')-u_C(t_3')$.

In an alternative embodiment, which is particularly advantageous when the parasitic inductance ($L_{ESL}$) is small and the parasitic inductances of the measurement circuit itself and the parasitic capacitance of the non-ideal switches are non negligible, the parasitic inductance ($L_{ESL}$) may be determined as follows. First, a measurement is performed with a known reference capacitor having a negligible or known parasitic inductance ($L_{ESLref}$). Because of the presence of parasitic inductances ($L_{par}$) of the measurement circuit and the parasitic capacitance ($C_{par}$) of the non-ideal switches, the voltage $u_C(t)$ will oscillate between $t_3$ and $t_4$, and possibly also after $t_4$ in FIG. 5A. This oscillation frequency $f_{oscref}$ is measured. Assuming that the parasitic inductance ($L_{ESLref}$) of the reference capacitor is negligible, the oscillation frequency will be equal to:

$$f_{oscref} = \frac{1}{2\pi\sqrt{L_{par} \cdot C_{par}}}$$

The parasitic capacitance ($C_{par}$) of the non-ideal switches may be measured using any known technique, so that the equation above will allow one to calculate the parasitic inductance ($L_{par}$) of the measurement circuit.

Next, a measurement is performed with the capacitor C under test having a parasitic inductance ($L_{ESL}$). Because of the presence of the parasitic inductance ($L_{ESL}$), the parasitic inductances ($L_{par}$) of the measurement circuit and the parasitic capacitance ($C_{par}$) of the non-ideal switches, the voltage $u_C(t)$ will oscillate between $t_3$ and $t_4$, and possibly also after $t_4$ in FIG. 5A. This oscillation frequency $f_{osc}$ is measured. The oscillation frequency will be equal to:

$$f_{osc} = \frac{1}{2\pi\sqrt{(L_{par}+L_{ESL}) \cdot C_{par}}}$$

Since the parasitic inductances ($L_{par}$) of the measurement circuit and the parasitic capacitance ($C_{par}$) are known, see above, the parasitic inductance ($L_{ESL}$) can be calculated using the equation above and the value of the measured oscillation frequency $f_{osc}$. In other words, by comparing the oscillation frequency $f_{oscref}$ of a calibrated set-up with the oscillation frequency $f_{osc}$ of the set-up with the capacitor under test, the parasitic inductance ($L_{ESL}$) can be determined.

The parasitic resistance $R_{ESR}$ can be calculated on the basis of at least the third and second voltage value for the voltage $u_C$ across the capacitor at respectively the third and the second point in time $t_3$, $t_2$. If a transition period from $t_{on}$ to $t_{off}$ is used, $t_3$ then preferably coincides with the highest value for $u_C$ during this transition period and $t_2$ with the minimum of $u_C$ at the end of discharging, just before switching, see FIG. 5A. The parasitic resistance ($R_{ESR}$) can then be calculated as $$R_{ESR}=U_{ESR}/(I_{OUT}+I_{Lmax})$$

wherein $I_{Lmax}$ is the maximum value of the current $i_L$ through boost coil 10, and $I_{OUT}$ is the average value of the current $i_{OUT}$ during the switching transition period $t_{trans}$. In the example of FIG. 5A $U_{ESR}=u_C(t_3)-u_C(t_2)$.

If a transition period $t_{trans}'$ from $t_{off}$ to $t_{on}$ is used, $t_3'$ then preferably coincides with the lowest value for $u_C$ during this transition period and $t_2'$ with the maximum of $u_C$ at the end of charging, just before switching, see FIG. 5B. The parasitic resistance ($R_{ESR}$) can then be calculated as $$R_{ESR}=U_{ESR}/(I_{OUT}+I_{Lmin})$$

wherein $I_{Lmin}$ is the minimum value of the current $i_L$ through boost coil 10, and $I_{OUT}$ is the average value of the current $i_{OUT}$ during the switching transition period $t_{trans}'$. In the example of FIG. 5B $U_{ESR}=u_C(t_2')-u_C(t_3')$.

In order to determine the leakage resistance $R_{leak}$ a third switching element (not shown) can be provided in series with capacitor 3. This third switching element is normally closed and does not affect the above discussed measurements. In order to determine the leakage resistance the capacitor can be charged to a determined voltage, for instance a voltage $u_C(t_5)$ at point in time $t_5$. At $t_5$ the third switching element is then opened for a period $(t_6-t_5)$ and at $t_6$ the voltage across capacitor $u_C(t_6)$ is measured again. The leakage resistance $R_{leak}$ can then be determined on the basis of the following formula:

$$R_{leak} = \frac{-(t_6 - t_5)}{C_{TEST} \ln\left[\frac{u_C(t_6)}{u_C(t_5)}\right]}$$

Figure 6:
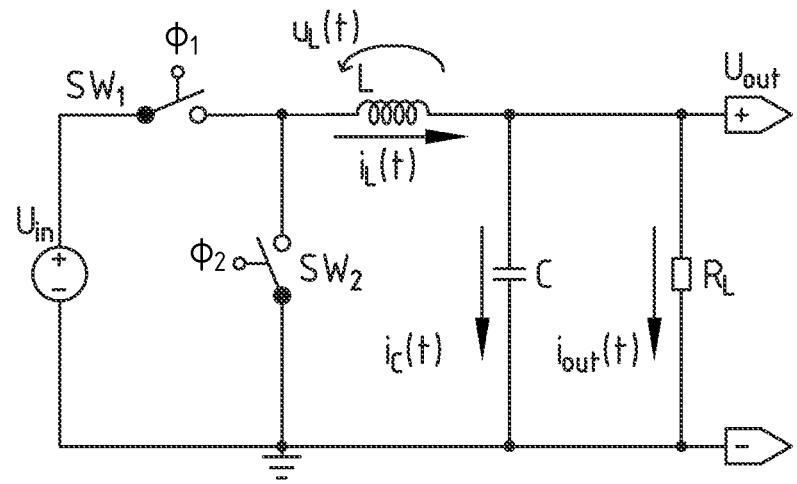
FIGS. 6-21 show other possible embodiments of the measurement setup.

FIGS. 6-12 illustrate other variants of DC-DC converters which can be used in embodiments of the invention. FIG. 6 is a buck converter. In such a converter the current $i_C(t)$ through the capacitor has a substantially triangular progression. Depending on the type of capacitor to be modelled and/or the applications for which the capacitor is intended, such a buck converter will optionally be preferred to the use of a boost converter.

Figure 7:
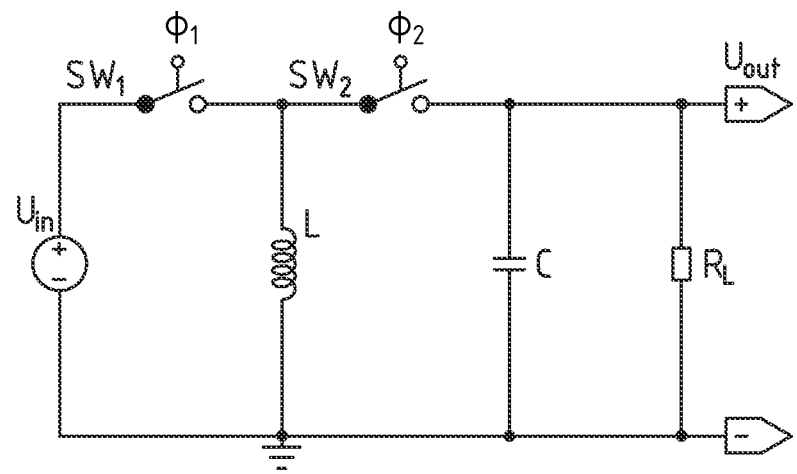
Figure 8:
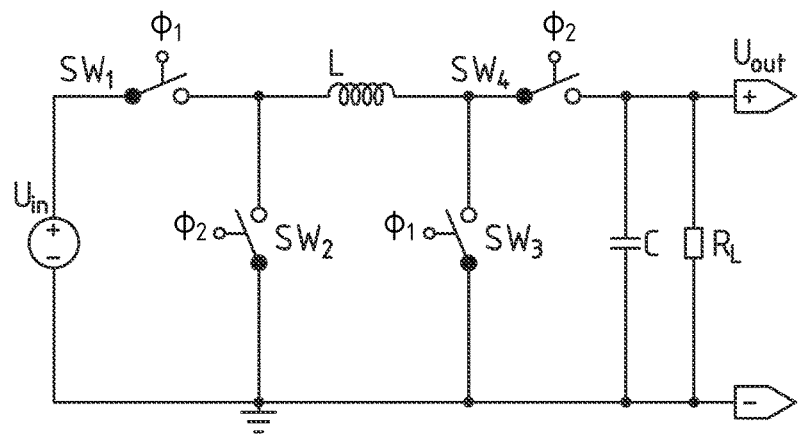

FIG. 7 is a buck-boost converter. In such a converter the current $i_C(t)$ through the capacitor has a progression similar to the current $i_C(t)$ through the capacitor of a boost converter. FIG. 8 is a non-inverting buck-boost converter. Such a converter will allow both a substantially block-shaped and a substantially triangular progression of the current $i_C(t)$ to be brought about through the capacitor, whereby the modelling can take place even more accurately.

Figure 9:
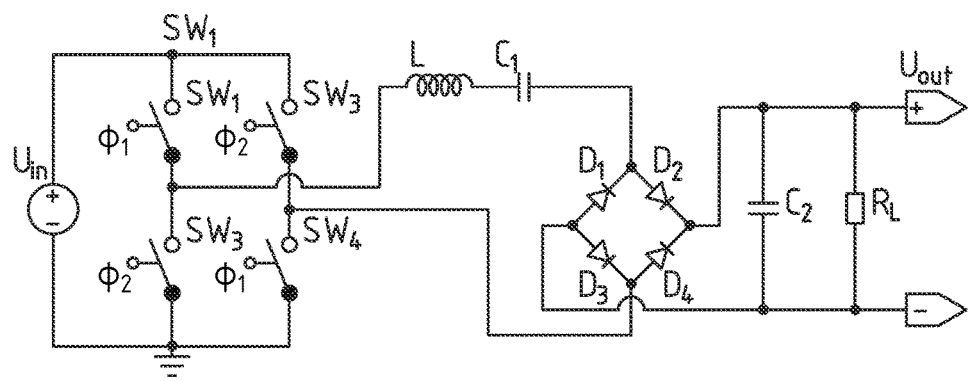

FIG. 9 is a series resonant converter. With such a converter two capacitors C1 and C2 can be modelled simultaneously. This converter allows very sharp discontinuous current peaks to be generated in C2 and large sine amplitudes in C1, whereby capacitors can be modelled in a wide field of applications.

Figure 10:
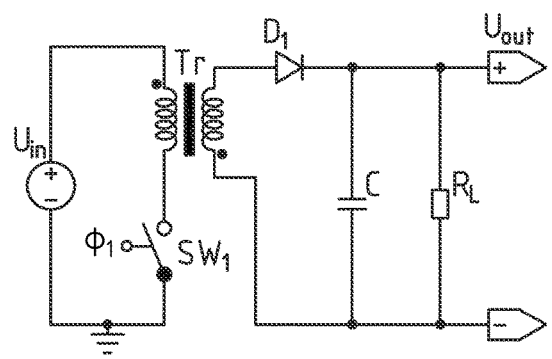
Figure 11:
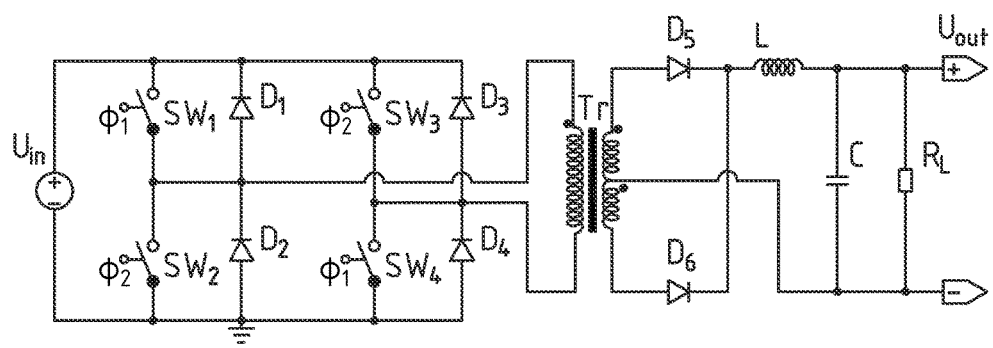

FIG. 10 is a fly-back converter. The operation hereof is largely the same as the operation of a boost converter, with the difference that due to the presence of a transformer the turns ratio thereof can be selected such that high voltages are generated. Such a converter is particularly suitable for modelling high-voltage capacitors. FIG. 11 is a full bridge converter. The operation of this converter is largely the same as the operation of a buck converter, with the difference that due to the presence of a transformer the turns ratio thereof can be selected such that high voltages are generated. Such a converter is particularly suitable for modelling high-voltage capacitors.

Figure 12:
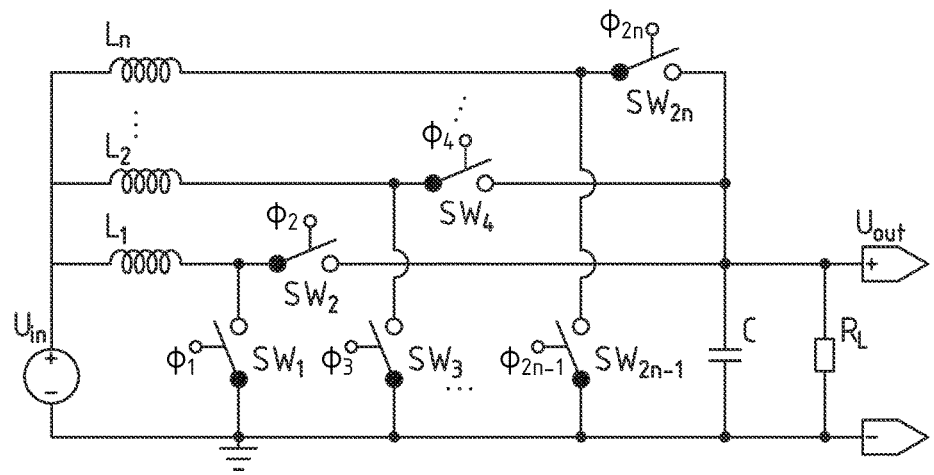
Figure 13:
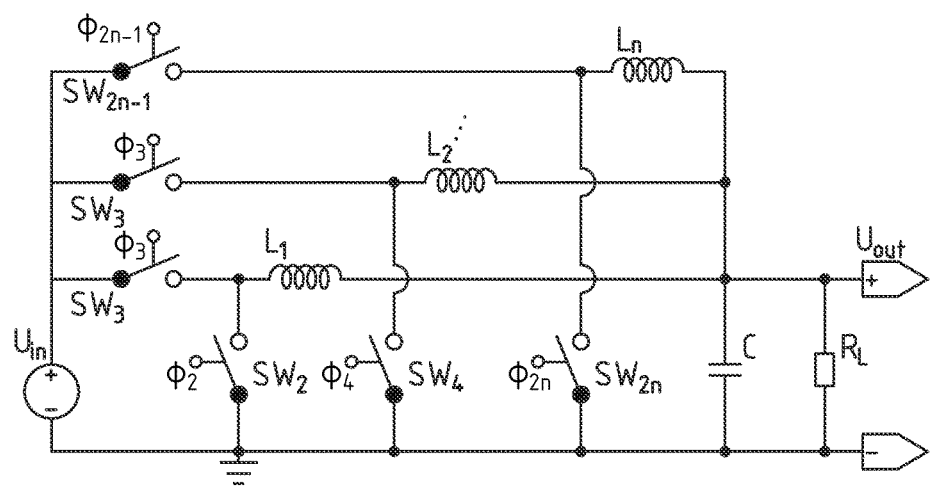

FIG. 12 is a multi-boost converter. FIG. 13 is a multi-buck converter. The converters of FIGS. 12 and 13 allow very complex current and voltage progressions to be generated in capacitor C and high currents to be generated in capacitor C. Such a converter is particularly suitable for modelling high-power capacitors.

Figure 14:
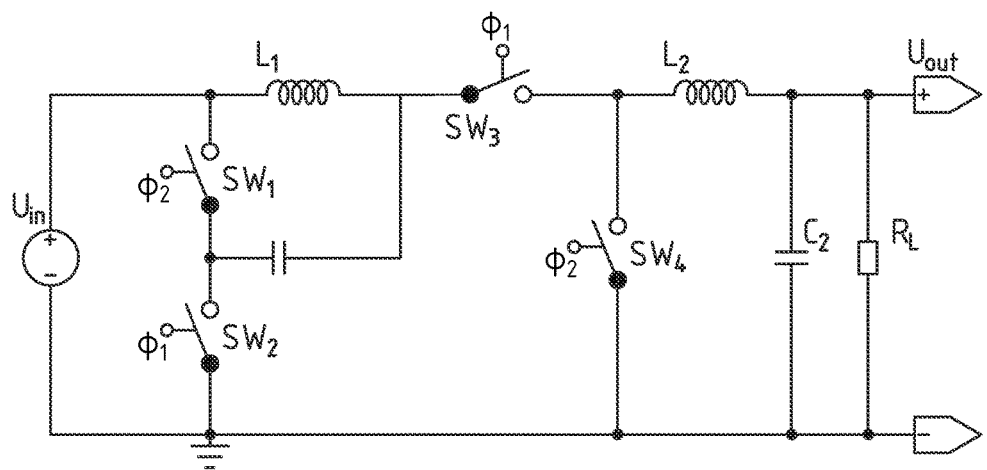
Figure 15:
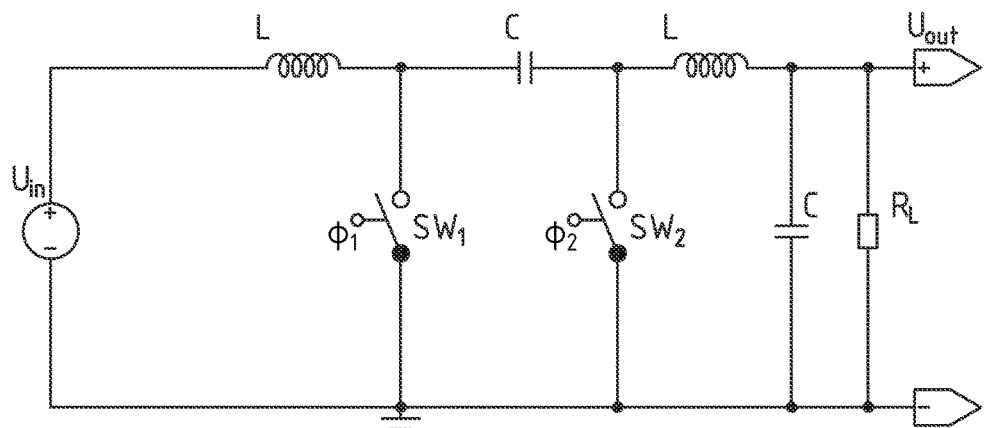

FIG. 14 is a buck square converter. With such a converter two capacitors C1 and C2 can be modelled simultaneously, wherein C1 is subject to a typical boost converter operation and C2 to a typical buck converter operation. FIG. 15 is a cuk converter. With such a converter two identical capacitors C can be modelled simultaneously, wherein the first C is subject to a typical boost converter operation and the second C to a typical buck converter operation.

Figure 16:
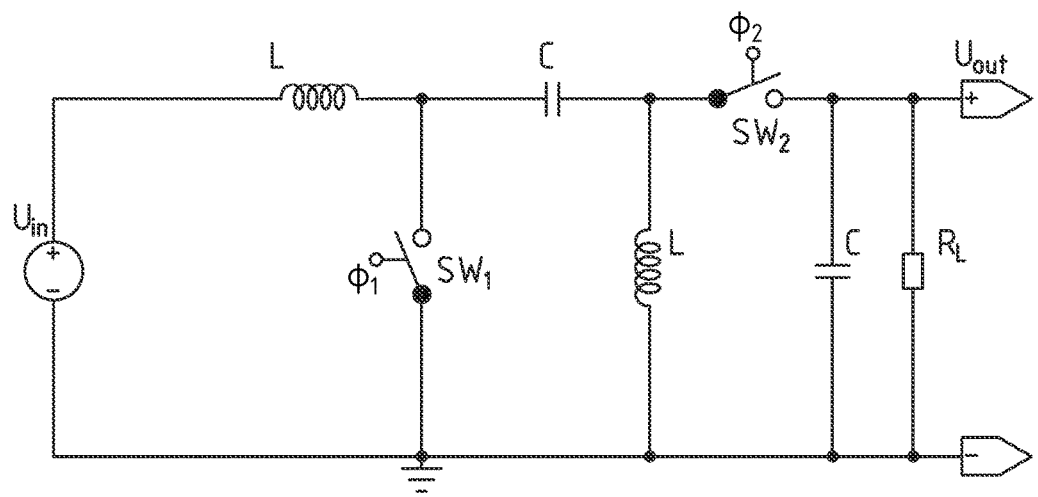
Figure 17:
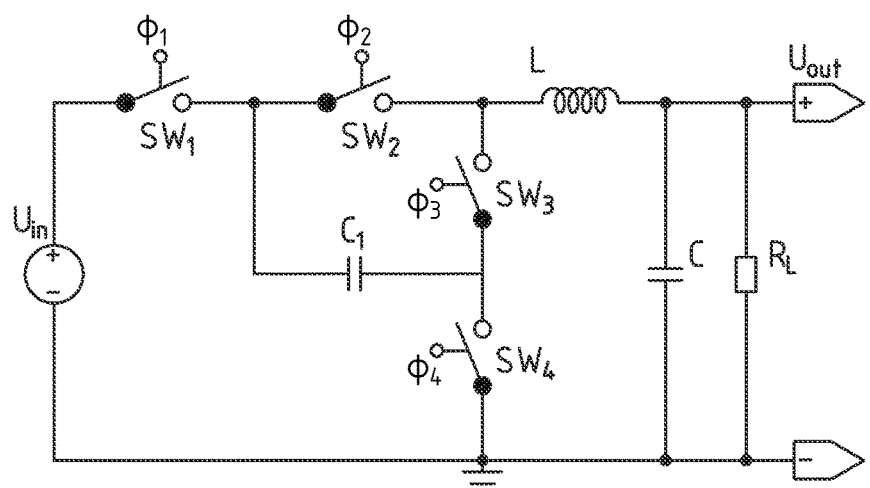
Figure 18:
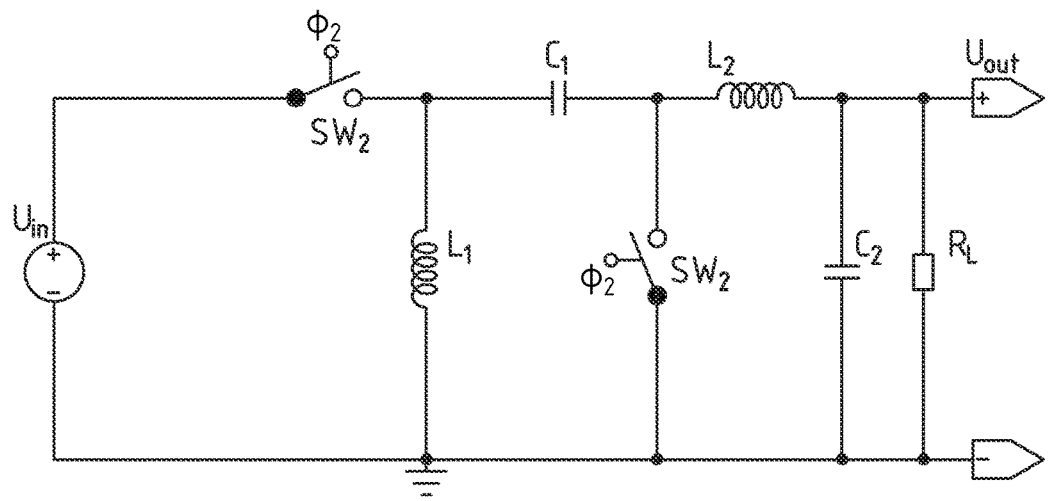

FIG. 16 is a sepic converter (single-ended primary-inductor converter). With such a converter two identical capacitors C can be modelled simultaneously, wherein the first C is subject to a typical buck converter operation and the second C to a typical boost converter operation. FIG. 17 is a three level converter. With such a converter two capacitors C1 and C2 can be modelled simultaneously, wherein C1 is subject to a typical boost converter operation and C2 to a typical buck converter operation. FIG. 18 is a reverse sepic converter. With such a converter two capacitors C1 and C2 can be modelled simultaneously, wherein C1 is subject to a typical buck converter operation and C2 to a typical boost converter operation.

Figure 19:
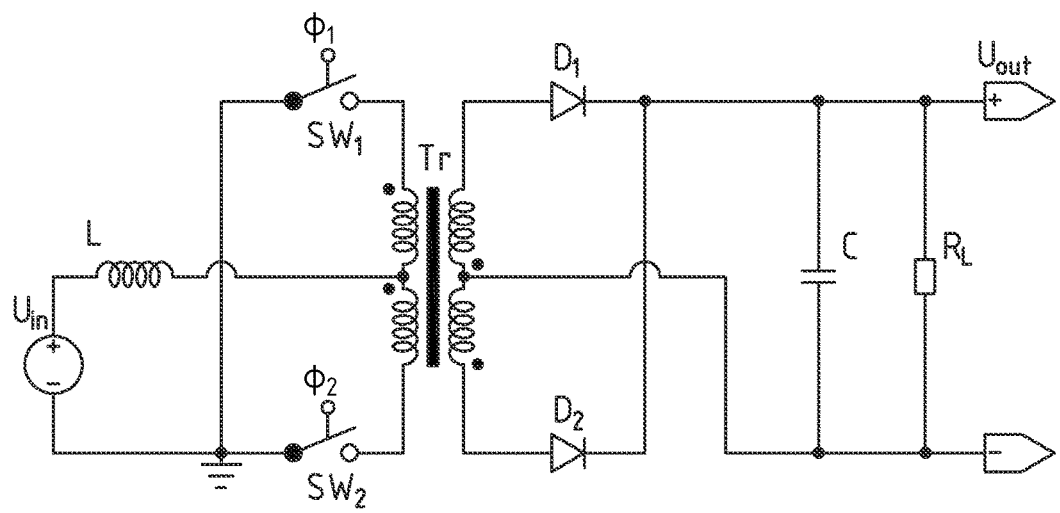

FIG. 19 is a push-pull converter. Due to the presence of a transformer the turns ratio hereof can be selected such that high voltages are generated. Such a converter is particularly suitable for modelling high-voltage capacitors.

Figure 20:
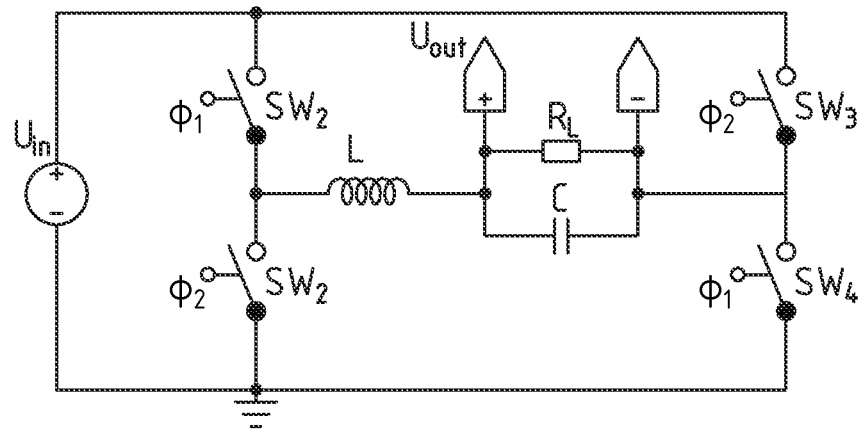
Figure 21:
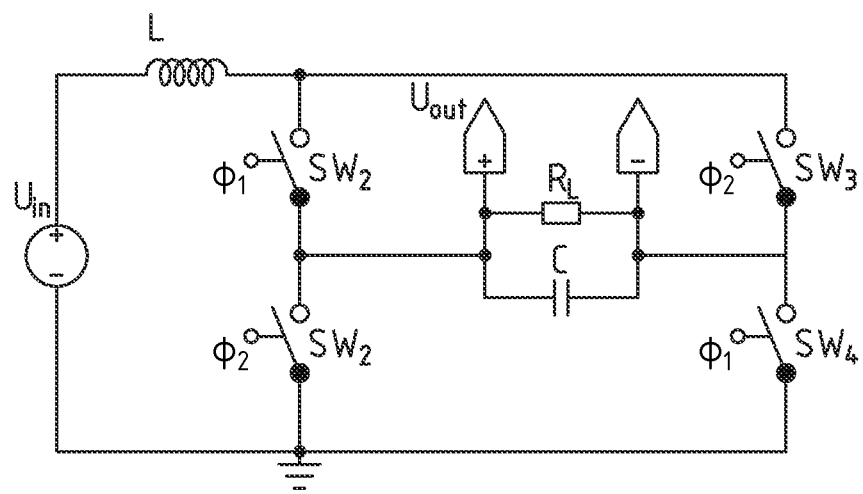

FIG. 20 is a bridge converter. This converter displays a behaviour more or less the same as the behaviour of a buck converter. FIG. 21 is a current-fed bridge converter. This converter displays a behaviour more or less the same as the behaviour of a boost converter.

Since the measurement and calculation principles are the same as those which have been described with reference to FIGS. 1-5, they will not be further elucidated.

As example of the method according to the invention, a commercial capacitor was modelled using the method according to the invention. The manufacturer states as model parameters $C_{TEST}$=10 uF@50V, $R_{ESR}$=100 m Ohm. This capacitor was then measured using an embodiment of the method according to the invention. The results were as follows: $C_{TEST}$=4.3 uF, $R_{ESR}$=543 m Ohm, $L_{ESS}$=16.4 nH@ 50V, 1 MHz, $I_{ripple}=I_{Cmax}-I_{Cmin}$=0.5 A, duty-cycle=50%. This demonstrates that the existing models will not produce good results in circuit simulations, in contrast to capacitors modelled according to an embodiment of the method according to the invention. The capacitors are after all never used at 0 Hz (DC), but typically at significantly higher frequencies.

The invention is not limited to the above described exemplary embodiments, and the skilled person will appreciate that many changes and modifications can be envisaged within the scope of the invention, which is defined solely by the following claims.

The invention claimed is:

1. A method for measuring a capacitor and calculating model parameters for the capacitor to be modelled, the method comprising the following steps of:
   incorporating the capacitor to be modelled into a DC to DC converter with at least a first switching element; which DC to DC converter has input terminals and output terminals;
   connecting a resistive load between the output terminals of the DC to DC converter;
   applying an input voltage to the input terminals of the DC to DC converter;
   controlling, with a control device, the first switching element in accordance with a frequency and duty cycle in order to obtain a current varying periodically in time through the capacitor to be modelled, which current depends at least for a part of a period on the input voltage;

measuring, with a first measuring device, at least a first quantity representative of the current through the capacitor at successive points in time in at least said part of a period;

measuring, with a second measuring device, at least a second quantity representative of the voltage across the capacitor at successive points in time in at least said part of a period;

determining on the basis of the measured first quantity at least one current value for the current through the capacitor;

determining on the basis of the measured second quantity at least one voltage value for the voltage across the capacitor;

repeating the above stated steps for at least one of: a different input voltage, a different frequency, a different duty cycle, a different resistive load;

calculating, in a computer device, model parameters of the capacitor on the basis of the measured quantities;

wherein the model parameters comprise a capacitance, a parasitic inductance intended for connection in series to the capacitance, and at least one of the following: a parasitic resistance intended for connection in series to the capacitance, a loss power;

wherein the DC to DC converter comprises a coil and a second switching element which are arranged and controlled by the control device such that in the coil the current builds up in the coil in a first position of the first switching element and that in the coil the current falls away in the coil in a second position of the first switching element;

wherein the method further comprises:

determining, in the computer device, on the basis of the measured second quantity at least a third and fourth voltage value for the voltage across the capacitor at respectively a third and a fourth point in time ($t_3$, $t_4$) of the successive points in time in said part of the period; which third and fourth points in time are located in a transition period during which the first switching element switches;

calculating, in the computer device, the parasitic inductance on the basis of at least the third and fourth voltage value.

2. The method as claimed in claim 1, further comprising of: measuring a quantity representative of the current through the resistive load at successive points in time in at least said part of a period.

3. The method as claimed in claim 1, further comprising of: measuring a quantity representative of the current through the coil at successive points in time in at least said part of a period.

4. The method as claimed in claim 1, wherein the capacitor is connected in parallel to the resistive load.

5. The method as claimed in claim 1, wherein the DC-DC converter is configured to display at least one of a boost converter behaviour and a buck converter behaviour.

6. The method as claimed in claim 1, further comprising of:
determining on the basis of the measured second quantity at least a first and second voltage value for the voltage across the capacitor at respectively a first and a second point in time ($t_1$, $t_2$) of the successive points in time, which first and second points in time are chosen during discharge of the capacitor in the resistive load;
calculating the capacitance of the capacitor on the basis of at least the first and second voltage value, the time difference between the first and second points in time ($t_1$, $t_2$) and the resistance of the resistive load.

7. The method as claimed in claim 1, wherein the successive points in time cover a substantially complete period.

8. The method as claimed in claim 1, wherein the model parameters comprise a loss power, wherein the loss power is calculated as an integral of the product of the voltage across the capacitor and the current through the capacitor on the basis of the measurements of the first and second quantity at the successive points in time, wherein the successive points in time preferably cover a substantially complete period.

9. The method as claimed in claim 1, characterized in that the parasitic inductance ($L_{ESL}$) is calculated as $$L_{ESL} = \text{abs}(U_4 - U_3) t_{trans} / (I_{OUT} + I_L)$$

wherein $U_4$ and $U_3$ are respectively the third and fourth voltage value, $t_{trans}$ is the transition period, $I_{OUT}$ is the average current through the resistive load during the transition period and $I_L$ is the maximum or minimum input current in the DC-DC converter depending on whether the capacitor switches from discharge to charge or vice versa; wherein the third point in time ($t_3$) is chosen as a time at which the voltage value is maximal or minimal depending on whether the capacitor switches from discharge to charge or vice versa, and wherein the fourth point in time ($t_4$) corresponds to the end of the transition period.

10. A method for measuring a capacitor and calculating model parameters for the capacitor to be modelled, the method comprising the following steps of:

incorporating the capacitor to be modelled into a DC to DC converter with at least a first switching element; which DC to DC converter has input terminals and output terminals;

connecting a resistive load between the output terminals of the DC to DC converter;

applying an input voltage to the input terminals of the DC to DC converter;

controlling, with a control device, the first switching element in accordance with a frequency and duty cycle in order to obtain a current varying periodically in time through the capacitor to be modelled, which current depends at least for a part of a period on the input voltage;

measuring, with a first measuring device, at least a first quantity representative of the current through the capacitor at successive points in time in at least said part of a period;

measuring, with a second measuring device, at least a second quantity representative of the voltage across the capacitor at successive points in time in at least said part of a period;

determining on the basis of the measured first quantity at least one current value for the current through the capacitor;

determining on the basis of the measured second quantity at least one voltage value for the voltage across the capacitor;

repeating the above stated steps for at least one of: a different input voltage, a different frequency, a different duty cycle, a different resistive load;

calculating, in a computer device, model parameters of the capacitor on the basis of the measured quantities;

wherein the model parameters comprise a capacitance a parasitic inductance intended for connection in series to the capacitance, and at least one of the following: a parasitic resistance intended for connection in series to the capacitance, a loss power;

wherein the DC to DC converter comprises a coil and a second switching element which are arranged and controlled by the control device such that in the coil the current builds up in the coil in a first position of the first switching element and that in the coil the current falls away in the coil in a second position of the first switching element;
wherein the model parameters comprise a parasitic resistance, wherein the method further comprises of:
determining, in the computer device, on the basis of the measured second quantity at least two voltage values for the voltage across the capacitor at respectively a second and a fourth point in time ($t_2$, $t_4$) of the successive points in time in said part of the period; which second and fourth point in time are located in a transition period during which the first switching element switches;
calculating, in the computer device, the parasitic resistance on the basis of at least the two voltage values.

11. The method as claimed in claim 10, wherein the parasitic resistance ($R_{ESR}$) is calculated as $$R_{ESR} = abs(U_4 - U_2)/(I_{OUT} + I_L)$$

wherein $U_4$ and $U_2$ are respectively the two voltage values at the fourth and second points in time ($t_4$, $t_2$), $I_{OUT}$ is the average current through the resistive load during the transition period and $I_L$ is the maximum or minimum input current in the DC-DC converter depending on whether the capacitor switches from discharge to charge or vice versa; wherein the second point in time ($t_2$) corresponds to the beginning of the transition period, and
wherein the fourth point in time ($t_4$) corresponds to the end of the transition period.

12. The method as claimed in claim 1, wherein said part of the period comprises a first part in which the capacitor is discharged in the resistive load and that this first part has a time duration $t_{on}$, and comprises a second part in which the capacitor is charged via the DC-DC converter and that this second part has a time duration $t_{off}$.

13. The method as claimed in claim 1, wherein the DC to DC converter is a boost converter.

14. The method as claimed in claim 1, wherein the DC to DC converter is one of the following: a buck converter, buck-boost converter, non-inverting buck-boost converter, a sepic converter (single-ended primary-inductor converter), a reverse sepic converter, a cuk converter, a resonant converter, a push-pull converter, a fly-back converter, full bridge converter.

15. The method as claimed in claim 1, wherein the inductance of the coil is higher than 500 microH.

16. A method for measuring a capacitor and calculating model parameters for the capacitor to be modelled, the method comprising the following steps of:
incorporating the capacitor to be modelled into a DC to DC converter with at least a first switching element; which DC to DC converter has input terminals and output terminals;
connecting a resistive load between the output terminals of the DC to DC converter;
applying an input voltage to the input terminals of the DC to DC converter;
controlling, with a control device, the first switching element in accordance with a frequency and duty cycle in order to obtain a current varying periodically in time through the capacitor to be modelled, which current depends at least for a part of a period on the input voltage;
measuring, with a first measuring device, at least a first quantity representative of the current through the capacitor at successive points in time in at least said part of a period;
measuring, with a second measuring device, at least a second quantity representative of the voltage across the capacitor at successive points in time in at least said part of a period;
determining on the basis of the measured first quantity at least one current value for the current through the capacitor;
determining on the basis of the measured second quantity at least one voltage value for the voltage across the capacitor;
repeating the above stated steps for at least one of: a different input voltage, a different frequency, a different duty cycle, a different resistive load;
calculating, in a computer device, model parameters of the capacitor on the basis of the measured quantities;
wherein the model parameters comprise a capacitance a parasitic inductance intended for connection in series to the capacitance, and at least one of the following: a parasitic resistance intended for connection in series to the capacitance, a loss power;
wherein the DC to DC converter comprises a coil and a second switching element which are arranged and controlled by the control device such that in the coil the current builds up in the coil in a first position of the first switching element and that in the coil the current falls away in the coil in a second position of the first switching element;
wherein the method further comprises determining, in the computer device, on the basis of the measured second quantity an oscillation frequency for the voltage across the capacitor between respectively a third and a fourth point in time ($t_3$, $t_4$) of the successive points in time in said part of the period; which third and fourth points in time are located in a transition period during which the first switching element switches; and calculating, in the computer device, the parasitic inductance on the basis of the measured oscillation frequency.

17. The method of claim 16, wherein the parasitic inductance ($L_{ESL}$) is determined using the equation:

$$f_{osc} = \frac{1}{2\pi\sqrt{(L_{par} + L_{ESL}) \cdot C_{par}}}$$

wherein $f_{osc}$ is the measured oscillation frequency, $L_{par}$ is the parasitic inductance of a measurement circuit including the DC-DC convertor, and $C_{par}$ the parasitic capacitance of the non-ideal first and second switches.

18. Storage medium on which computer instructions are stored for performing at least the calculation steps of the method of claim 1.

19. Storage medium on which computer instructions are stored for performing at least the calculation steps of the method of claim 16.

20. The method of claim 1, wherein the resistive load is connected in series to a choke coil for blocking high-frequency AC currents.

* * * * *